United States Patent
Buckley

(10) Patent No.: US 6,536,608 B2
(45) Date of Patent: Mar. 25, 2003

(54) SINGLE CAST VERTICAL WAFER BOAT WITH A Y SHAPED COLUMN RACK

(75) Inventor: Richard Buckley, Shrewsbury, MA (US)

(73) Assignee: Saint-Gobain Ceramics & Plastics, Inc., Worcester, MA (US)

(*) Notice: Subject to any disclaimer, the term of this patent is extended or adjusted under 35 U.S.C. 154(b) by 0 days.

(21) Appl. No.: 09/904,149

(22) Filed: Jul. 12, 2001

(65) Prior Publication Data

US 2003/0010730 A1 Jan. 16, 2003

(51) Int. Cl.$^7$ ............................................... A47G 19/08
(52) U.S. Cl. .................. 211/41.18; 211/40; 211/181.1; 414/935; 206/832
(58) Field of Search ...................... 211/40, 41.1, 41.4, 211/41.18, 181.1; 206/454, 832, 307.1; D6/627–635, 407, 462–468, 449, 455, 456, 458, 461; D13/182; 414/935

(56) References Cited

U.S. PATENT DOCUMENTS

| | | | | |
|---|---|---|---|---|
| D192,017 S | * | 1/1962 | Moore ........................... | D6/465 |
| D192,054 S | * | 1/1962 | Caccia .......................... | D6/462 |
| 4,471,716 A | * | 9/1984 | Milliren ....................... | 118/320 |
| D311,102 S | * | 10/1990 | Prendergast ................. | D6/462 |
| 5,188,240 A | * | 2/1993 | Marino et al. ............. | 206/308.1 |
| 5,314,077 A | * | 5/1994 | Theosabrata ................. | 211/40 |
| 5,358,124 A | * | 10/1994 | Mueller ........................ | 211/40 |
| D352,848 S | * | 11/1994 | Dardashti .................... | D6/464 |
| D364,979 S | * | 12/1995 | Thomas et al. .............. | D6/465 |
| D380,925 S | * | 7/1997 | Chu .............................. | D6/463 |
| 5,788,088 A | * | 8/1998 | Kao .......................... | 206/308.1 |
| D397,561 S | * | 9/1998 | DePottey et al. ............ | D6/455 |
| 5,984,115 A | * | 11/1999 | Koestenblatt et al. ......... | 211/40 |
| 6,039,186 A | * | 3/2000 | Bhatt et al. ................. | 206/454 |
| 6,126,020 A | * | 10/2000 | Mok ...................... | 108/147.11 |
| D435,189 S | * | 12/2000 | Mok ............................ | D6/407 |
| 6,202,861 B1 | * | 3/2001 | Mah ............................. | 211/40 |
| D441,246 S | * | 5/2001 | Chow et al. ................. | D6/468 |
| D444,061 S | * | 6/2001 | Dardashti .................... | D9/430 |
| D453,654 S | * | 2/2002 | Kwok .......................... | D6/468 |
| 2002/0066705 A1 | * | 6/2002 | Chow et al. .................. | 211/40 |

* cited by examiner

Primary Examiner—Daniel P. Stodola
Assistant Examiner—Jennifer E. Novosad
(74) Attorney, Agent, or Firm—McCormick, Paulding & Huber LLP

(57) ABSTRACT

A vertical ceramic wafer boat for supporting a silicon wafer having a predetermined radius "R". The wafer boat comprises a base portion and a column rack, which extends generally vertically upwards from the base portion. The column rack includes a pair of vertical column rack supports extending generally vertically upwards from the base portion. The column rack also includes a plurality of wafer supports having a generally Y shaped cross section. The wafer supports extend substantially horizontally from the column rack supports to define a plurality of slots within the column rack sized to receive the wafer.

18 Claims, 5 Drawing Sheets

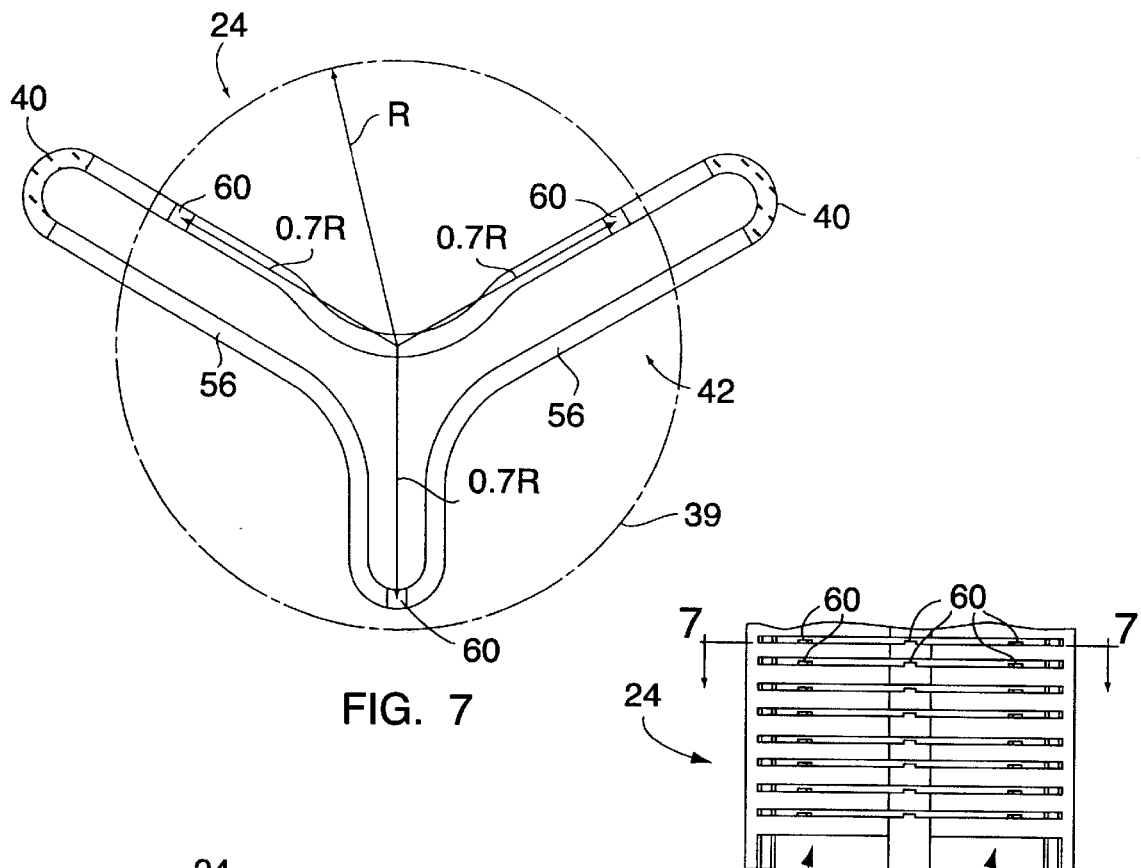
FIG. 7
FIG. 7a
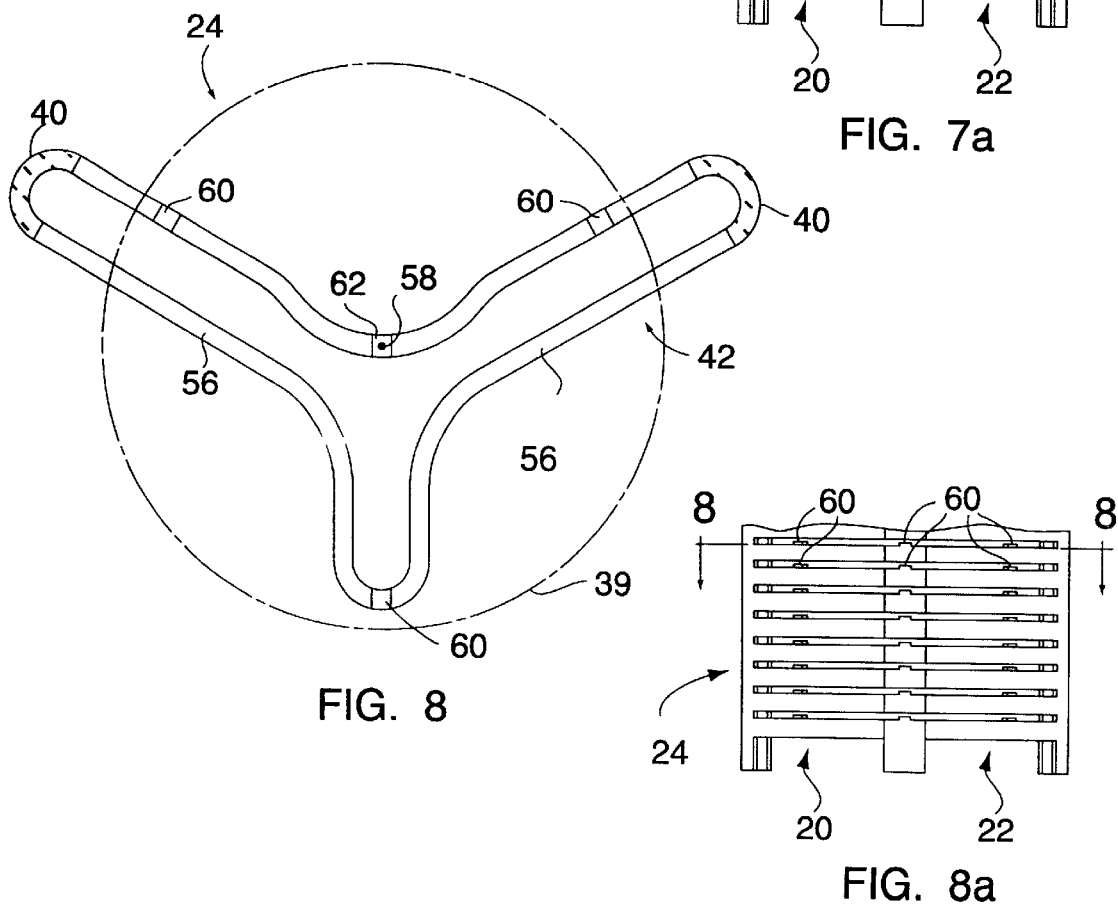
FIG. 8
FIG. 8a

SINGLE CAST VERTICAL WAFER BOAT WITH A Y SHAPED COLUMN RACK

CROSS-REFERENCE TO RELATED APPLICATIONS

Some of the material disclosed herein is disclosed and claimed in the following U.S. patent application Ser. No. 09/904,143 entitled "A Wafer Boat With Arcuate Wafer Support Arms", by R. Buckley et al, which is hereby incorporated by reference and filed concurrently herewith.

FIELD OF THE INVENTION

The present invention relates to semiconductor manufacturing. More specifically, the present invention relates to vertical wafer boats having Y shaped column racks (or columns) made from a single casting.

BACKGROUND OF THE INVENTION

Although other materials may be used, e.g., Silicon-Germanium (SiGe) or Galium Arsenide (GaAs), Silicon (Si) is presently the most important semiconduct or for the electronics industry. Very Large Scale Integrated (VLSI) circuit technology (i.e., up to about 100,000 devices per chip), and Ultra Large Scale Integrated (ULSI) circuit technology (i.e., more than 100,000 and in some cases exceeding one billion devices per chip) being based almost entirely on silicon.

It is critical that the fabrication of VLSI and ULSI circuits which take place on silicon substrates possess very high crystalline perfection or purity. That is, in crystalline solids, the atoms which make up the solid are spatially arranged in a periodic fashion. If the periodic arrangement exists throughout the entire solid, the substance is defined as being formed of a single crystal. The periodic arrangement of the atoms in the crystal is called the lattice. Very high crystalline perfection requires that the silicon substrate possess a minimum of impurities and structural defects throughout its single crystal silicon lattice.

Generally, raw material, e.g., quartzite, is refined into electronic grade polysilicon (EGS) and melted. A silicon seed crystal is than used to grow a single crystal silicon ingot from the molten EGS. The ingot is than precisely sliced and polished into silicon wafers. The silicon wafers provide the substrates upon which VLSI and ULSI circuits are ultimately built through a complex sequence of wafer fabrication processes.

The increasing size of silicon wafers is one of the most obvious trends in silicon material technology. Presently, 300 mm diameter wafers are expected to ultimately replace most 150 mm and 200 mm wafer applications. It is also predicted that 400 mm wafers will probably be introduced in the not too distant future. The use of larger diameter wafers for maintaining productivity presents several major challenges to semiconductor manufactures. For example, facilities with equipment capable of handling the larger wafers, e.g., vertical furnaces, must be built. New patterning techniques must be developed to print smaller feature sizes over larger areas. The larger wafers must also be thicker to increase their resistance to warping and other structural deformations. Moreover, the larger wafers are also heavier, requiring the use of automated wafer transport systems.

As the silicon wafers become bigger and heavier, the problem of preventing impurities and structural defects to the lattice, i.e., of maintaining very high crystalline perfection, becomes even more critical. Two such structural defects, which becomes especially problematic in 300 mm silicon wafers and larger, are that of "back side damage" and "slip" in the lattice structure.

Back side damage is when a wafer moves across a surface of a wafer support device, causing scratches in the back side of the wafer.

Slip in silicon wafers is a function of the stress applied to the wafer. This stress can be mechanical (e.g., frictionally induced) and/or thermal. As the wafers are stressed, the crystal lattice undergoes elastic deformation that disappears as the solid crystal returns to its original position upon release of the stress. However, severe stress leads to slip, which is the plastic or permanent deformation in the crystal lattice, which remains when the stress is released. Slip occurs when the elastic limit (or yield strength) of the silicon is exceeded and the lattice becomes permanently misaligned.

Slip is common during high temperature processing of silicon wafers in heat treatment furnaces (furnacing operations), as thermal stress is proportional to the processing temperature. The transition temperature from brittle to ductile behavior of the wafer is generally within the range of about 720 to 1000 degrees C. Therefore slip, whether induced by thermal or mechanical stress, becomes especially problematic at process temperatures above 720 degrees C.

Wafer boats are wafer support devices, which are subjected to furnacing operations during semiconductor wafer processing. Horizontal wafer boats are typically designed to support a horizontal row of wafers, which are inserted into a horizontal furnace tube for high temperature processing. Vertical wafer boats are typically designed to support a vertical stack of wafers, which are inserted into a vertical furnace tube. Generally, for large diameter silicon wafers, e.g., 300 mm, vertical wafer boats are more commonly used. This is because vertical furnaces have a smaller foot print than horizontal furnaces and therefore take up less of the expensive manufacturing space. Additionally, vertical furnaces generally demonstrate better temperature control than horizontal furnaces.

Wafer boats are generally composed of ceramic materials. Ceramic materials, which are joined by ionic or covalent bonds, are typically composed of complex compounds containing both metallic and non metallic elements. Ceramics typically are hard, brittle, high melting point materials with low electrical and thermal conductivity, good chemical and thermal stability, and high compressive strengths. Examples of ceramic materials are quartz, silicon carbide (SiC) and recrystalized SiC. One such recrystalized SiC is available from Saint-Gobain Ceramics & Plastics, Inc. of Worcester, Mass., under the trade name CRYSTAR®. This material is a silicon carbide ceramic that has been impregnated with high purity silicon metal.

Referring to FIG. 1, a typical prior art vertical wafer boat 10 generally includes three or four support rods 12 extending vertically upwards from a generally circular horizontal base 14, and spaced radially along the periphery of the base. The rods 12 have a plurality of cantilevered wafer support arms (or teeth) 16 supported only at one end, which extend inwardly toward the center of the base 14 to define a series of slots therebetween. The slots are sized to receive the silicon wafers, which are supported by the arms 16 during furnacing operations.

Problematically for larger wafers, the prior art wafer support arms 16 provide most of their support at the outer periphery of the wafer. Accordingly, most of the weight of the wafer is unsupported and distributed toward its center.

Therefore, during high temperature thermal processing, the center of the wafers tend to sag, promoting slip in the crystal lattice of the wafer.

Because of the geometry of the circular wafers, substantially half of the weight of the wafer, i.e., the inner wafer weight, is distributed within a circular area that is 70 percent the radius (R) of the wafer. Conversely, half of the weight of the wafer, i.e., the outer wafer weight, is distributed over a doughnut shaped area that has an inner radius of 0.7 R and an outer radius of 1.0 R. As a result, supporting the wafers at or about the 0.7 R circular boundary region of a wafer, e.g., from 0.6 R to 0.8 R, balances the inner and outer wafer weights and greatly reduces the potential for sagging during high temperature thermal processing.

Current prior art boat designs require deep slots, thereby making the arms 16 of the support rods 12 long enough to extend to the 0.7 R point. However, manufacturing this geometry is cumbersome due to the precise machining required and the inherently low yield rates. Also the added length of the cantilevered arms impose a large moment force at the single support point where the arm attaches to the rod body, unduly increasing the probability of failure or breakage. Moreover, because the arms provide support at only three or four small discrete areas on the wafers, the possibility of back side damage is enhanced for the heavier wafers.

Ideally, providing actual structural support at the center region of a wafer would eliminate the problem of sag in the center. However, the above problems associated with support arms 16 extending to the 0.7 R point of a wafer, become even more pronounced if the arms 16 are required to reach further to the center point of the wafer. Additionally, the longer arms would make it very difficult for conventional transfer equipment to reach and move the wafers in an out of the slots.

One prior art attempt to solve this problem, is to provide a plurality of discrete circular ceramic rings. The rings may be sized to support the 0.7 R region of the wafers, e.g., 210 mm rings for 300 mm wafers, or the edge region of the wafers, e.g., edge rings. The rings would be slid into each slot and the wafer's would then rest upon each ceramic ring. However, the rings greatly add to the cost of the boat. Additionally, the rings essentially enclose the support area where the wafers rest, making it difficult for conventional transfer equipment to remove the wafers from the slots. Also, since the rings typically add up to 100 additional discrete moving parts to the boats (one for each slot), the potential for generating damaging microscopic particles, or causing back side damage, is greatly enhanced.

One such apparatus designed to support the wafers at the 0.7 R boundary without using discrete rings is disclosed in the above cross-referenced U.S. Patent Application tilted "A Wafer Boat With Arcuate Wafer Support Arms". In that design, a pair of opposing arcuate column racks are utilized to support the wafers at the 0.7 R region.

Another problem associated with current prior art wafer boats is that the complexity of their design requires them to be manufactured from discrete separate components, e.g., top plates, bases, rods, columns (or column racks) and tabs. The separate components are generally cast individually and then assembled by welding or other fastening means. Because of the varying cross sections of the existing designs, casting or extruding is not possible for an entire assembly, thereby greatly adding to the cost of the prior art wafer boats.

Accordingly, there is a need for an improved wafer boat, which can provide a single cast construction with enhanced support to reduce wafer sag in large diameter silicon wafers, while also providing maximum openness for material handling at a reasonable cost.

SUMMARY OF THE INVENTION

The present invention offers advantages and alternatives over the prior art by providing a wafer boat having a column rack for stacking silicon wafer. The column rack having a generally Y shaped cross section.

The invention provides a substantial number of advantages over the prior art. The Y cross sectional shape provides enhanced support for both the 0.7 R regions and the central regions of a wafer. Additionally, the column rack and/or the entire wafer boat may be manufactured from a single casting or a single extrusion.

These and other advantages are accomplished in an exemplary embodiment of the invention by providing a vertical ceramic wafer boat for supporting a silicon wafer having a predetermined radius R. The wafer boat comprises a base portion and a column rack, which extends generally vertically upwards from the base portion. The column rack includes a pair of vertical column rack supports extending generally vertically upwards from the base portion. The column rack also includes a plurality of wafer supports having a generally Y shaped cross section. The wafer supports extend substantially horizontally from the column rack supports to define a plurality of slots within the column rack sized to receive the wafer.

In an alternative embodiment of the invention, the wafer supports of the wafer boat comprise first and second wafer support legs each forming a branch of the Y shaped cross section. The first and second legs have substantially equal lengths greater than the radius R of the wafers. Each leg extends inwardly from the vertical column rack supports from an anchored distal end. A third wafer support leg forms a third branch of the Y shaped cross section and terminates in a free distal end.

In another embodiment the column rack is formed from a single casting. Additionally, the base portion may be have a generally Y shaped cross section and the entire wafer boat may be formed from a single casting.

In another alternative embodiment of the invention, the wafer supports of the wafer boat include a plurality of raised pads spaced to provide support for the 0.7 R region of the wafer. Additionally, the wafer supports may also include a raised center pad located to provide support for the central region of the wafer.

BRIEF DESCRIPTION OF THE DRAWINGS

FIG. 7 is a top cross-sectional view of a Y support of FIG. 7a, taken along the line 7—7 thereof;

FIG. 7a is an exemplary embodiment of a partial front view of a Y support with three raised wafer support pads;

FIG. 8 is a top cross-sectional view of a Y support of FIG. 8a, taken along the line 8—8 thereof;

FIG. 8a is an exemplary embodiment of a partial front view of a Y support with four raised wafer support pads;

DETAILED DESCRIPTION OF THE PREFERRED EMBODIMENTS

Figure 1:
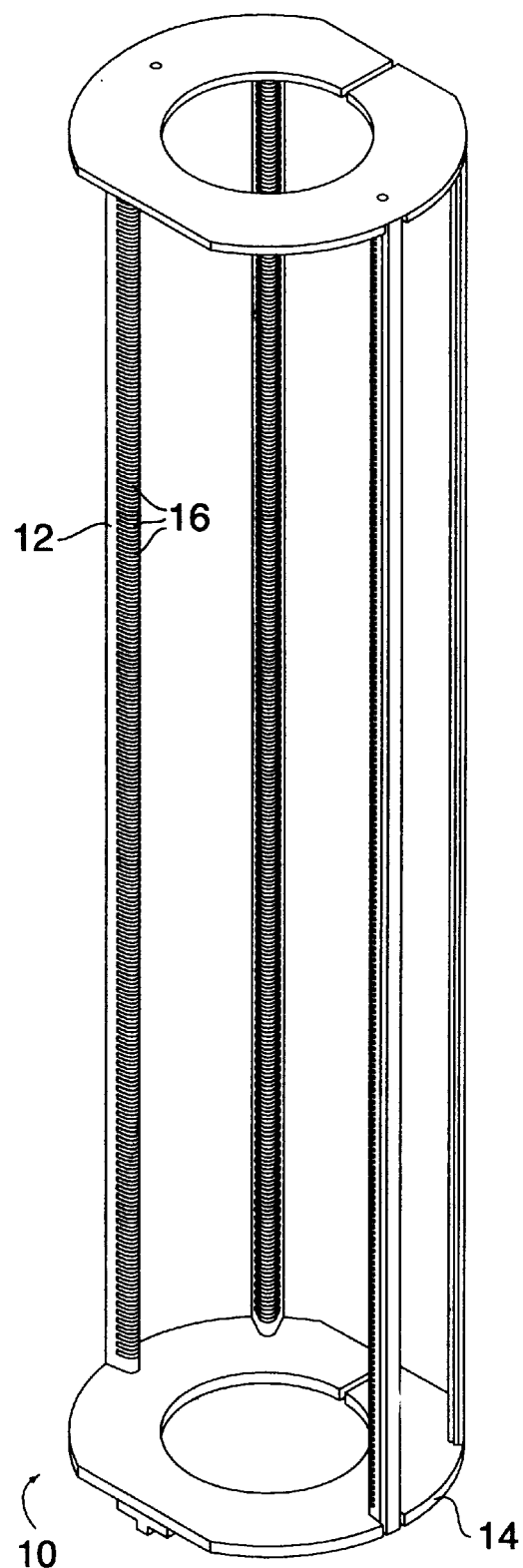
FIG. 1 is a perspective view of an exemplary embodiment of a prior art vertical wafer boat.
Figure 2:
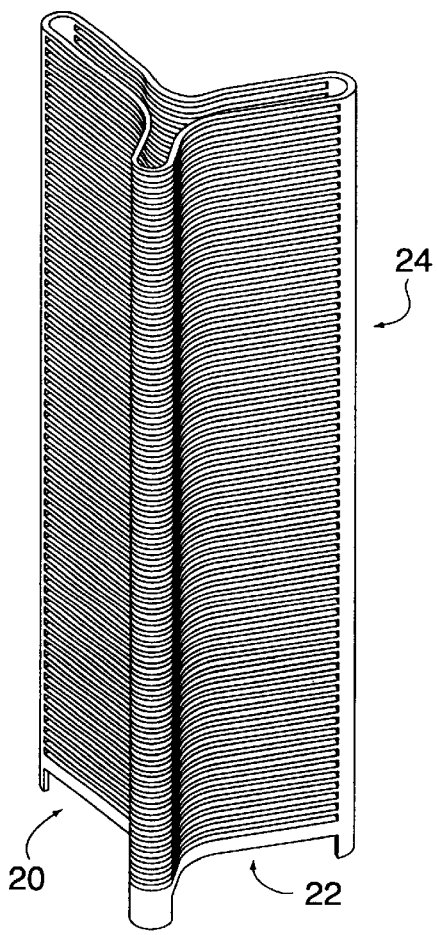
FIG. 2 is a perspective view of an exemplary embodiment of a wafer boat with Y shaped vertical column rack in accordance with the present invention.
Figure 3:
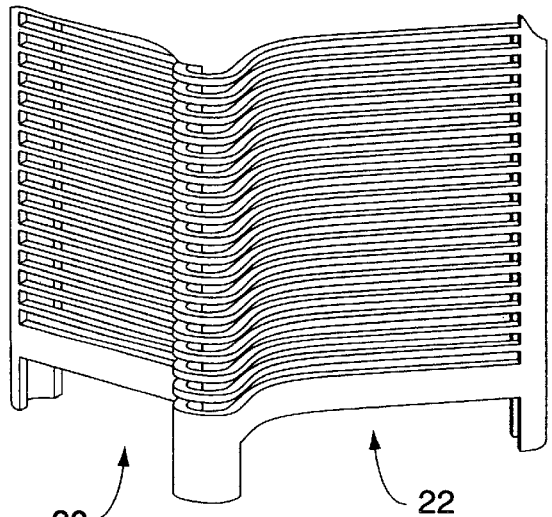
FIG. 3 is a perspective close-up view of the wafer boat of FIG. 2.
Figure 4:
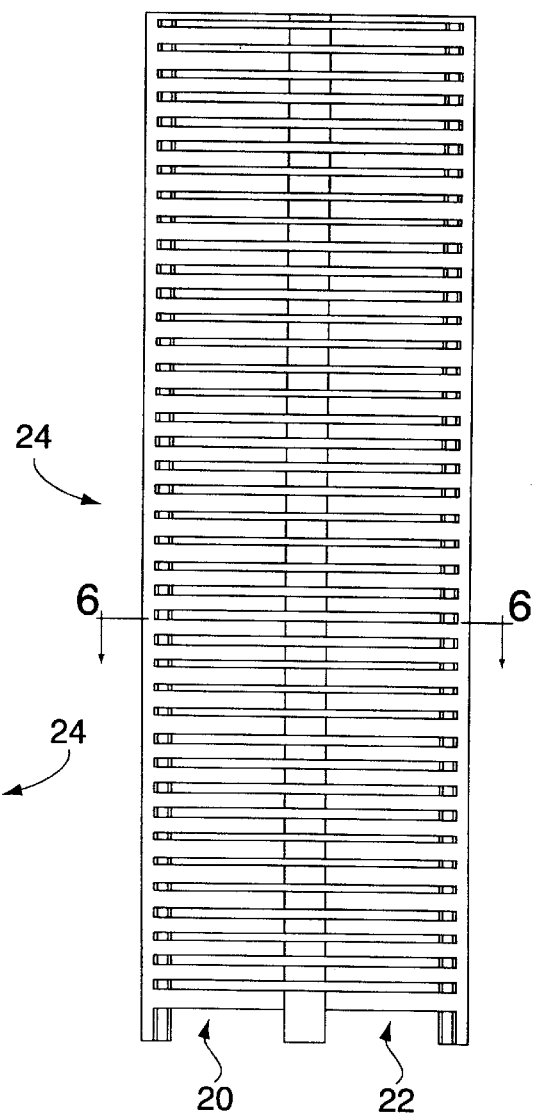
FIG. 4 is a front view of the wafer boat of FIG. 2.

Referring to FIGS. 2–4, an exemplary embodiment of a vertical wafer boat in accordance with the present invention is shown generally at 20. The entire wafer boat 20, i.e., the body of the wafer boat, is composed of recrystalized SiC. The wafer boat 20 includes a generally Y shaped base portion 22 integrally attached to a generally Y shaped slotted vertical column rack 24, i.e., the Y column rack. As will be explained in greater detail hereinafter, the Y column rack 24 is sized to advantageously provide support to a silicon wafer at its 0.7 R boundary region and its center region. Moreover, the general Y shape of the wafer boat 20 enables it to be manufactured from a single casting or extrusion.

Figure 5:
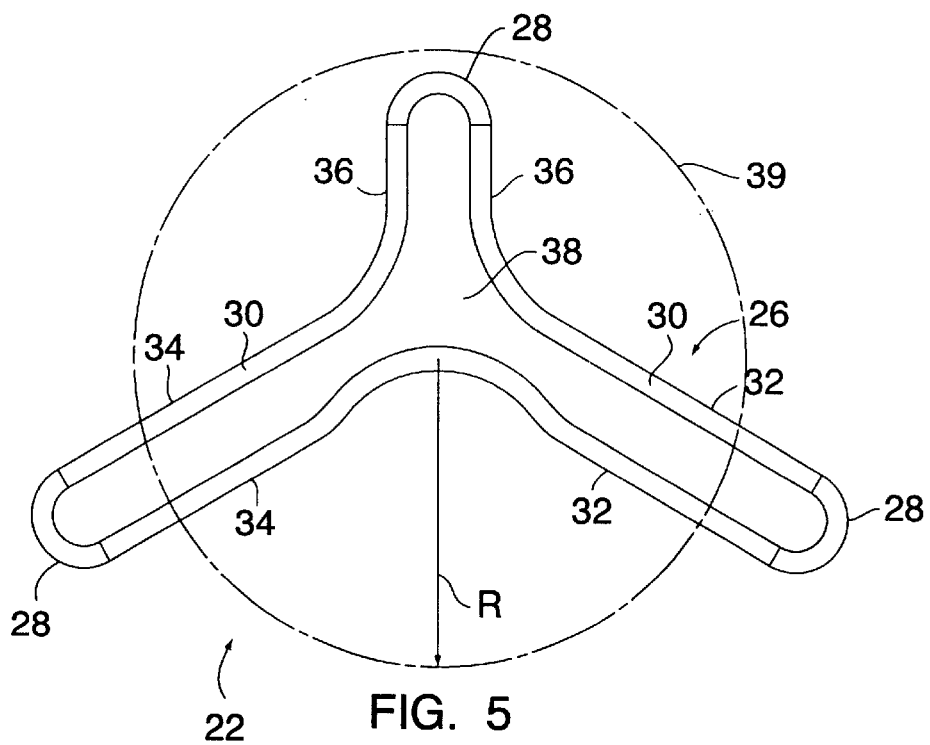
FIG. 5 is a bottom view of the wafer boat of FIG. 2.

Referring to FIG. 5, the base portion 22 has a hollow Y shaped horizontal datum end section 26 integrally attached to three vertically extending feet 28 to form a cross-sectional frame shaped generally like a coat hanger. The bottom surface 30 of the datum end section 26 is precisely machined to provide a reference surface from which robotic transfer equipment can accurately locate the wafers 39 (shown in phantom) stacked on the wafer boat 20. The datum end section 26 includes three pairs of legs 32, 34 and 36 spaced substantially 120 degrees apart to form the hollow Y shape. Two of the leg pairs 32 and 34 are of substantially equal length and extend outwardly from the hollow central region 38 a distance greater than the radius R of the wafers 39. Leg 36 is respectively shorter than the other two legs 32 and 34. The feet 28 are designed to interface with a vertical furnace pedestal (not shown) in order to correctly orient the wafer boat 20 during a furnacing operation.

In this embodiment, the base portion 22 is described as being generally of the same shape as the Y column rack 24 and integrally attached thereto. However, one skilled in the art would recognize that the base portion 22 may be a separately assembled component, e.g., welded on, and can have several other shapes as well, e.g., circular or rectangular.

Figure 6:
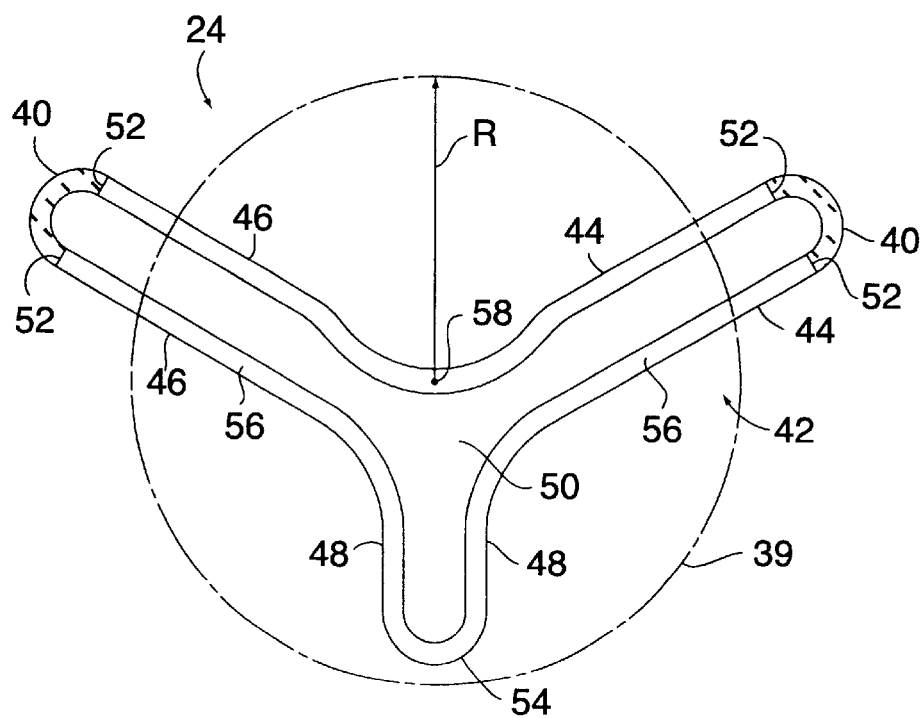
FIG. 6 is an exemplary embodiment of a cross-sectional view of a Y support without wafer support pads, taken along the line 6—6 of FIG. 4.

Referring to FIG. 6, the Y column rack 24 includes a pair of elongated vertical column rack supports 40 having a generally C shaped cross section. A plurality of hollow ceramic wafer supports 42 having a generally Y shaped cross section extend substantially horizontally from the vertical column rack supports 40 to define a plurality of slots within the column rack sized to receive the wafers 39 (shown in phantom). The wafer supports 42 include three pairs of wafer support legs 44, 46 and 48 spaced substantially 120 degrees apart to form the three branches of the Y shape. Two pairs of the wafer support legs 44 and 46 are of substantially equal length and extend (i.e., inwardly from the vertical column rack supports 40) a distance greater than the radius R of the wafers 39. Each pair of legs 44 and 46 includes an anchored distal end 52 which is attached to the vertical column rack supports 40 to provide dual support for the ceramic wafer supports 42. The pair of legs 48 are respectively shorter than the radius R of the wafers 39 and are integrally attached to an arcuate cantilevered free distal end 54. The short pair of legs 48 and free distal end 54 allow for easy handling of the wafers by conventional robotic transfer equipment. That is the transfer equipment has room to straddle the shorter pair of legs 48 as it moves wafers in and out of the slots defined by the spaced free distal ends 54 of the wafer supports 42. In this embodiment, the entire top surface 56 of the wafer support 42 defines a wafer contact surface 56 upon which the wafer rests. The top surface 56 provides full support for the wafers 39 including the center section 58 of the wafer 39.

In this embodiment the wafer supports 42 are described as including three pairs of wafer support legs 44, 46 and 48 spaced substantially 120 degrees apart to form the hollow Y shape. However, one would recognize that the three branches of the Y may also be formed by a single solid leg. Moreover, the three branches of the Y may be spaced at other angles other than 120 degrees, e.g. 90, 135 and 135 degrees respectively.

Referring to FIG. 7, an alternative embodiment of the Y column rack 24 is shown with three raised mounting pads 60 mounted on the top surface 56. The three mounting pads are located to provide support for the 0.7R region of the wafer 39 and are substantially equally spaced 120 degrees apart. The raised pads 60 provide enhance support from sag to prevent slip, and further reduces the possibility of back side damage by raising the wafer off of the top surface 56. Though this embodiment shows the pads spaced equally, one skilled in the art would recognize that other numbers and spacings of pads may also be used, e.g., four pads spaces 90 degrees apart or three pads spaced at 0, 90 and 180 degrees respectively.

Referring to FIG. 8, another alternative embodiment of the Y column rack 24 is shown with the three equally spaced raised pads 60 and a fourth center support pad 62 for supporting the center section 58 of the wafer 39. The center support pad 62 provides superior support from sag while also protecting from back side damage.

Figure 9:
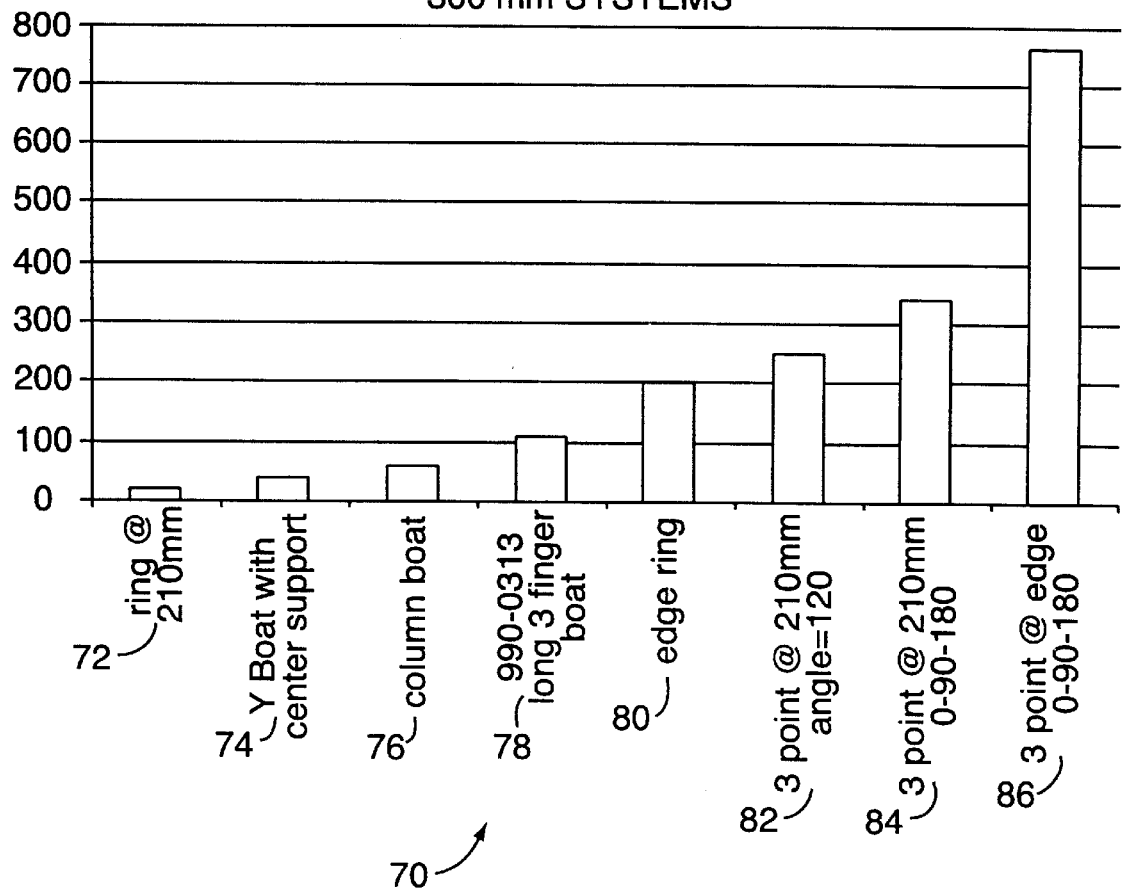
FIG. 9 is a comparison bar chart showing the gravitational sheer stress of 300 mm wafers on various wafer support structures.

Referring to FIG. 9, a comparison bar chart showing the Gravitational Shear Stress on 300 mm Wafers is shown at 70. The graph 70 compares the results of a finite element analysis for gravitational stress done on the various wafer support structures. Each bar 72–86 represents the gravitational stress, in pounds per square inch (psi), a 300 mm wafer would be subjected to during high temperature operations when supported by a particular support structure. In bar 72 the support structure is a prior art 210 mm (0.7R) ring. In bar 74, the support is the Y column rack 24 shown in FIG. 8 with wafers supports 42 having the three 0.7R pads 60 and the center pad 62. Bar 76 indicates the arcuate column rack boat of the above cross-referenced U.S. Patent Application tilted "A Wafer Boat with Arcuate Wafer Support Arms". Bar 78 is a prior art set of long fingers extending to the 0.7 R region of a wafer, and bar 80 is a prior art edge ring. In bar 82, the support is the Y column rack 24 shown in FIG. 7 with wafer supports 42 having only the three 0.7R pads 60, wherein the pads 60 are substantially equally spaced 120 degrees apart. Bar 84 is a support system having three raised pads located at the 0.7 R region and spaced at 0 degrees, 90 degrees and 180 degrees respectively. Finally, bar 86 is a support system having three raised pads located at the edge region of the wafer and spaced at 0 degrees, 90 degrees and 180 degrees respectively. As can be seen from the graph 70, the Y column rack with three pads (bar 82) offers good support, while the Y column rack with three pads and a center pad (bar 74) offers superior support.

In addition to enhanced support, the simple Y shape offers many other advantages over prior art wafer boat designs.

The entire Y shaped wafer boat 20 advantageously allows the boat 20 to be manufactured from a single casting. Alternatively, if the base portion 22 were designed as a separate assembly, the Y column rack 24 could be manufactured from a single casting. In either case a significant cost savings results. Additionally, the Y shape also allows the wafer boat 20 or Y column rack 24 to be manufactured as a single extrusion. Also the longer pairs of legs 32 and 34 of the Y shaped wafer supports 42 are anchored at distal ends 52 to both vertical column rack supports 40 in order to easily handle the moment forces of the wafer's weight on the cantilevered pair of legs 48. The shorter pair of legs 48 and their associated free distal end 54 allow easy access to the wafers for the wafer handling equipment.

Although this application discloses a Y shaped column rack 24 having a hollow center region, a solid Y shape is also within the scope of this invention. Moreover, even though the exemplary embodiments discuss a wafer boat sized for 300 mm diameter wafers, a wafer boat in accordance with this invention may be sized for other wafer diameters as well, e.g., 150 mm, 200 mm, or 400 mm. Additionally the wafer boat may also be composed of ceramics other than recrystalized SiC, e.g., quartz, sintered SiC, or poly-silicon.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A vertical ceramic wafer boat system comprising:
    a silicon wafer having a predetermined radius R; and
    a wafer boat for supporting the silicon wafer, the wafer boat including:
        a base portion, and
        a column rack extending generally vertically upwards from the base portion, the column rack including,
            solely two vertical column rack supports extending generally vertically upwards from the base portion, and
            a plurality of wafer supports having a generally Y shaped cross section extending substantially horizontally from the column rack supports to define a plurality of slots within the column rack sized to receive the wafer each of the wafer supports comprising first and second wafer support legs each forming a branch of the Y shaped cross section, the first and second legs having substantially equal lengths greater than the radius R of the wafer, each leg extending inwardly from the vertical column rack supports from a distal end that is anchored thereto, and a third wafer support leg forming a third branch of the Y shaped cross section, the third wafer support leg terminating in a cantilevered free distal end.

2. The wafer boat of claim 1 wherein the column rack is formed from a single casting.

3. The wafer boat of claim 1 wherein the base portion has a generally Y shaped cross section and the entire wafer boat is formed from a single casting.

4. The wafer boat of claim 1 wherein the wafer supports comprise a plurality of raised pads spaced to provide support for a 0.7 R region of the wafer.

5. The wafer boat of claim 4 wherein the plurality of raised pads comprises three raised pads spaced substantially 120 degrees apart.

6. The wafer boat of claim 5 wherein the wafer supports comprise a fourth raised center pad located to provide support for a central region of the wafer.

7. The wafer boat of claim 1 wherein the wafer supports comprise a raised center pad located to provide support for a central region of the wafer.

8. The wafer boat of claim 1 wherein the wafer supports each comprise:
    the first wafer support leg including a first pair of wafer support legs;
    the second wafer support leg including a second pair of wafer support legs; and
    the third wafer support leg including a third pair of wafer support legs;
    wherein the first, second and third pair of wafer support legs are integrally attached to define a hollow central region of the Y shaped cross section.

9. The wafer boat of claim 1 wherein the third wafer support leg has a length less than the radius R of the wafer.

10. The wafer boat of claim 1 wherein the first, second and third wafer support legs are spaced substantially 120 degrees apart.

11. The wafer boat of claim 1 wherein the ceramic is one of quartz, silicon carbide (SiC) and recrystalized SiC.

12. The wafer boat of claim 1 wherein the column rack is formed from a single extrusion.

13. The wafer boat of claim 1 wherein the base portion has a generally Y shaped cross section and the entire wafer boat is formed from a single extrusion.

14. A vertical ceramic wafer boat for supporting a silicon wafer, the wafer boat comprising:
    a base portion, and
    a column rack extending generally vertically upwards from the base portion, the column rack including,
        solely two vertical column rack supports extending generally vertically upwards from the base portion, and
        a plurality of wafer supports having a generally Y shaped cross section extending substantially horizontally from the column rack supports to define a plurality of slots within the column rack each of the wafer supports comprising first and second wafer support legs each forming a branch of the Y shaped cross section, the first and second legs having substantially equal lengths, each leg extending inwardly from the vertical column rack supports from a distal end that is anchored thereto, and a third wafer support leg forming a third branch of the Y shaped cross section, the third wafer support leg terminating in a cantilevered free distal end.

15. The wafer boat of claim 14 wherein the column rack is formed from a single casting.

16. The wafer boat of claim 14 wherein the base portion has a generally Y shaped cross section and the entire wafer boat is formed from a single casting.

17. The wafer boat of claim 14 wherein the wafer supports each comprise:
    the first wafer support leg including a first pair of wafer support legs;
    the second wafer support leg including a second pair of wafer support legs; and
    the third wafer support leg including a third pair of wafer support legs;
    wherein the first, second and third pair of wafer support legs are integrally attached to define a hollow central region of the Y cross section.

18. The wafer boat of claim 14 wherein the third wafer support leg has a length less than the first and second wafer support legs.

* * * * *